United States Patent [19]

White et al.

[11] Patent Number: 5,844,205
[45] Date of Patent: Dec. 1, 1998

[54] HEATED SUBSTRATE SUPPORT STRUCTURE

[75] Inventors: John M. White, Hayward; Larry Chang, Los Altos, both of Calif.

[73] Assignee: Applied Komatsu Technology, Inc., Tokyo, Japan

[21] Appl. No.: 635,270

[22] Filed: Apr. 19, 1996

[51] Int. Cl.⁶ .................................. F27B 5/14; F28F 7/00
[52] U.S. Cl. ........................... 219/390; 219/410; 392/418
[58] Field of Search ..................................... 219/390, 405, 219/410, 411; 392/416, 418; 118/50.1, 724, 725, 728; 373/110–112; 427/557, 559, 553; 432/152; 364/557

[56] References Cited

U.S. PATENT DOCUMENTS

| | | | |
|---|---|---|---|
| 5,033,538 | 7/1991 | Wagner et al. | 118/725 |
| 5,059,770 | 10/1991 | Mahawili | 219/390 |
| 5,180,000 | 1/1993 | Wagner et al. | 118/725 |
| 5,238,499 | 8/1993 | Van De Ven | 118/724 |
| 5,511,608 | 4/1996 | Boyd | 118/724 |
| 5,516,367 | 5/1996 | Lei et al. | 118/725 |
| 5,595,241 | 1/1997 | Jelinek | 118/725 |

*Primary Examiner*—John M. Jeffery
*Assistant Examiner*—J. Pelham
*Attorney, Agent, or Firm*—William J. Egan, III; Fish & Richardson

[57] ABSTRACT

A heated substrate support plate for use in a process chamber. The support plate has grooves disposed therein for receiving heating elements. The heating elements are comprised of an outer sheath, a heater coil and a heat-conducting filler material. The heating element is disposed within a groove and compressed to compact the heat-conducting filler material about the heater coil.

19 Claims, 6 Drawing Sheets

HEATED SUBSTRATE SUPPORT STRUCTURE

BACKGROUND OF THE INVENTION

The present invention relates generally to vacuum processing chambers, and more particularly to a heated substrate support plate for heating a substrate in a chemical vapor deposition chamber.

Chemical vapor deposition (CVD) is a process to deposit a thin film layer onto a substrate such as a silicon or glass substrate. In general, the substrate is supported in a vacuum deposition process chamber, and the substrate is heated to several hundred degrees Centigrade. Deposition gases are injected into the chamber, and a chemical reaction occurs to deposit a thin film layer onto the substrate. The thin film layer may be a dielectric layer (such as silicon nitride or silicon oxide), a semiconductor layer (such as amorphous silicon) or a metal layer (such as tungsten). The deposition process may be plasma enhanced (PECVD) or thermally enhanced.

A susceptor is a mechanical part that holds a substrate in the vacuum deposition process chamber. Typically, the susceptor includes a substrate support plate mounted on a stem, along with a lift assembly for raising and lowering the substrate within the vacuum process chamber. The substrate support plate is heated to facilitate the deposition process. Heating is needed to provide enough energy for the dielectric deposition process to occur. Typically, a heating element is included within the substrate support plate. The heating element maybe a tube assembly which includes a heater coil surrounded by an outer sheath.

Heat density refers to the amount of heat which is generated by a heating element over a given length of the element. Power density is a related concept which refers to the amount of power (in watts) which is dissipated over a given length of the element. Heating elements having high heat and power densities are preferable in vacuum deposition processes to minimize the area of the support plate occupied by the heating element, while still enabling the adequate heating of a substrate.

In order to achieve high heat and power density performance for the heating element, the outer sheath of the heating element has typically been constructed of various high temperature and rigid metals including incoloy. Incoloy is an alloy primarily composed of iron, nickel and chromium manufactured by The International Nickel Co., Inc.

However, problems arose in the compatibility of the heating element outer sheath with the substrate support plate in which it was mounted. Typically, the substrate support plate is constructed of aluminum or an aluminum alloy to take advantage of these material's high corrosion resistance and high thermal conductivity properties. While the selection of high temperature and rigid metals for use in the construction of the outer sheath of the heating element proved to be an excellent choice for improving the heat and power density performance, the same materials could not be used in constructing the substrate support plate. This is due to generally poor thermal conductivity and corrosion resistance properties and the high cost of these materials. Accordingly, the substrate support plate was constructed of a different material than that of the outer sheath of the heating element. If the substrate support plate and the heating element outer sheath are not constructed from the same material, then the thermal expansion characteristics of the dissimilar materials must either be nearly the same or must be compensated for in the design. Otherwise, failure of the heating element may occur.

Accordingly, it would be desirable to provide a heating element whose outer sheath is constructed of the same material as a substrate support plate while also allowing for high heat and power density performance.

It is therefore an object of the present invention to provide a heating element having an outer sheath constructed from the same material as a substrate support plate in which it is disposed for use in a vacuum process chamber.

It is a further object of the present invention to provide an improved heated substrate support plate including a heating element having compacted heat conducting filler material to assure proper heat dissipation for high heat and power density applications.

Additional objects and advantages of the invention will be set forth in the description which follows and in part will be obvious from the description, or may be learned by practice of the invention. The objects and advantages of the invention may be realized and obtained by means of the instrumentalities and combinations particularly pointed out in the claims.

SUMMARY OF THE INVENTION

The present invention is directed to a substrate support structure for heating and supporting a substrate in a process chamber. The substrate support structure includes a heated substrate support plate having a groove in a surface thereof for receiving a heating element. The heating element includes an outer sheath, a heater coil and a heat-conducting filler material disposed therebetween. The heating element is disposed within the groove, and then compressed to compact the heat-conducting filler material about the heater coil.

In general, in one aspect of the invention, the groove has a predetermined depth, and the heating element has a first dimension larger than the predetermined depth. The outer sheath of the heating element is deformed by compression so the heating element fits within the groove, with the heat-conducting filler material compacted about the heater coil.

In general, in another aspect of the invention, a substrate support structure includes a top plate and a bottom plate. The top surface of the top plate supports the substrate, and the bottom plate is joined to the top plate. The top plate or the bottom plate includes a groove having a first depth. A heating element is positioned in the groove and initially has a first dimension larger than the first depth. The outer sheath of the heating element is deformed by compression so the heating element fits within the groove, with the heat-conducting filler material compacted about the heater coil.

In general, in another aspect of the invention, the substrate support structure is disposed within a vacuum processing chamber for processing a substrate at a substrate processing location. The substrate support structure includes a base plate constructed from a first material which includes a top surface with a groove disposed therein for receiving a heating element having an outer sheath constructed from the first material.

In general, in another aspect of the invention, the substrate support plate includes a base plate having a plurality of grooves forming inner and outer loops about the base plate. The outer loop extends about a path adjacent to a perimeter of the base plate, and the inner loop extends about a path closer to a central portion of the base plate. A heating element is disposed within each of the plurality of grooves. The outer sheath of each heating element is deformed by compression so the heating element fits within a corresponding one of the of grooves such that the outer sheath of each heating element is flush with the top surface of the base plate. The heat-conducting filler material is compacted about the heater coil.

Among the advantages of the invention are the following. A substrate support structure having a substrate support plate and outer sheath of a heating element disposed therein constructed from the same material while providing high heat and power density performance.

BRIEF DESCRIPTION OF THE DRAWINGS

The accompanying drawings, which are incorporated and constitute a part of the specification, schematically illustrate the invention and, together with the general description given above and the detailed description given below, serve to explain the principles of the invention.

DESCRIPTION OF THE PREFERRED EMBODIMENT(S)

The present invention is directed to an apparatus for providing an improved heated substrate support plate including a heating element disposed therein for use in a vacuum deposition process chamber.

Figure 1:
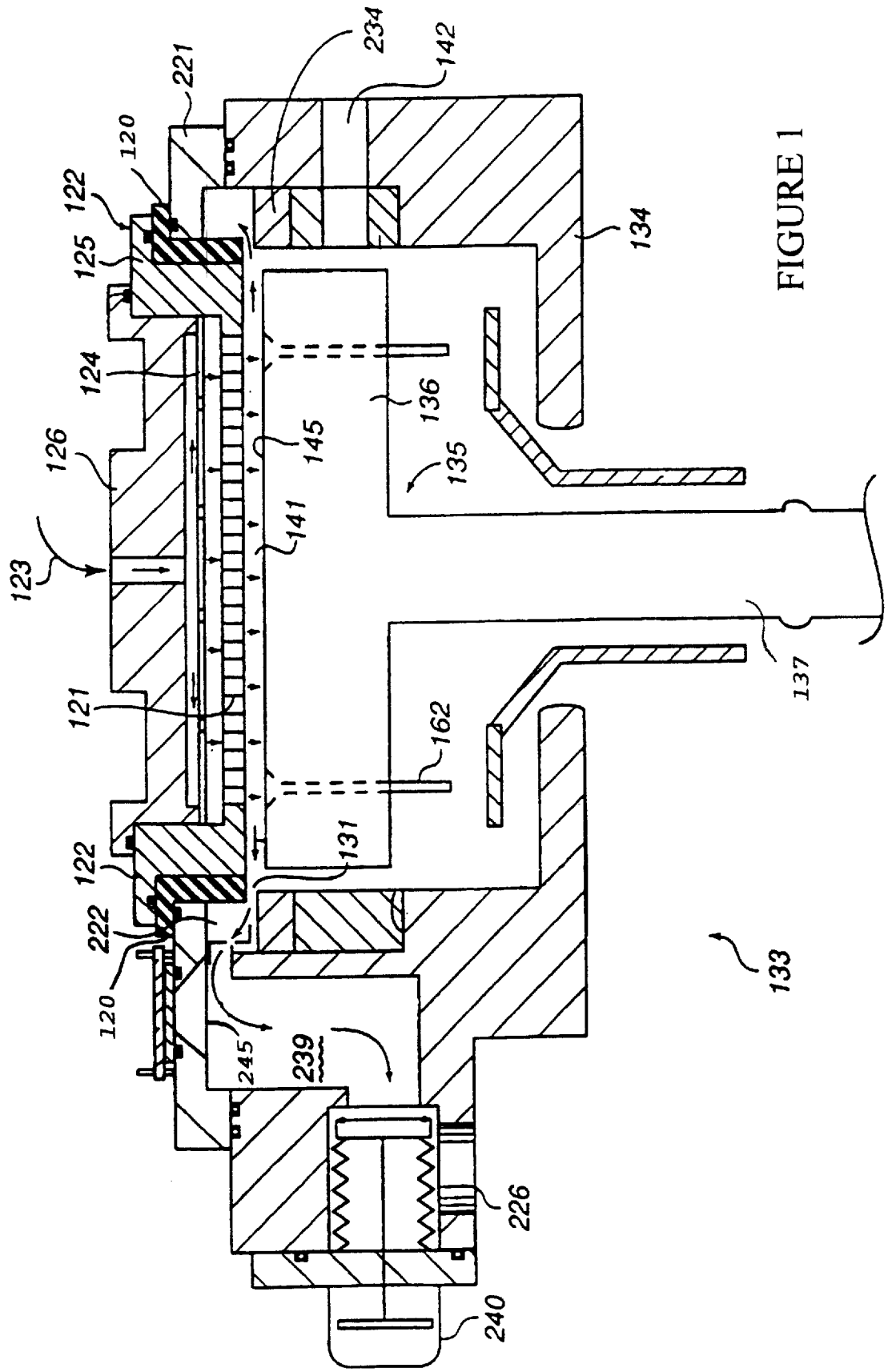
FIG. 1 shows a cross-section of a PECVD processing chamber according to one embodiment of the present invention.

As shown in FIG. 1, a susceptor 135 including a heated substrate support plate 136 mounted on a stem 137 is centered within a vacuum deposition process chamber 133. An upper face 145 of substrate support plate 136 supports a substrate, such as a glass panel or semiconductor wafer (not shown) at the substrate processing or reaction region 141. A lift mechanism (not shown) is provided to raise and lower susceptor 135. The heated substrate support plate has substrate lift pins 162 to facilitate the transfer of substrates into and out of the chamber by a robot blade (not shown) through an insertion or removal opening 142 in chamber sidewall 134.

The deposition process gases (indicated by arrow 123) flow into chamber 133 through an inlet manifold 126, a conventional perforated blocker plate 124 and holes 121 in a process gas distribution faceplate 122 (indicated by small arrows in substrate processing region 141 of FIG. 1). Upper face 145 of heated substrate support plate 136 is parallel and spaced-closely to faceplate 122. An RF power supply (not shown) applies electrical power between gas distribution faceplate 122 and susceptor 135 so as to excite the process gas mixture to form a plasma, in a PECVD process, within the region between faceplate 122 and susceptor 135. The constituents of the plasma react to deposit a desired film on the surface of the substrate on substrate support plate 136.

The deposition process gases may be exhausted from the chamber through a slot-shaped orifice 131 surrounding the reaction region into an exhaust plenum 222. Orifice 131 and plenum 222 are defined by the gap between the top of chamber sidewall 134, including upper dielectric lining 234 on the wall, and the bottom of chamber lid 221, including a dielectric insulator 120 between lid 221 and a perimeter flange 125 of gas distribution faceplate 122.

From exhaust plenum 222, the gases flow underneath a lateral extension portion 245 of the exhaust plenum, pass through a downward extended gas passage 239, by a vacuum shut-off valve 226, and into an exhaust outlet 240 which connects to an external vacuum pump (not shown).

Figure 2:
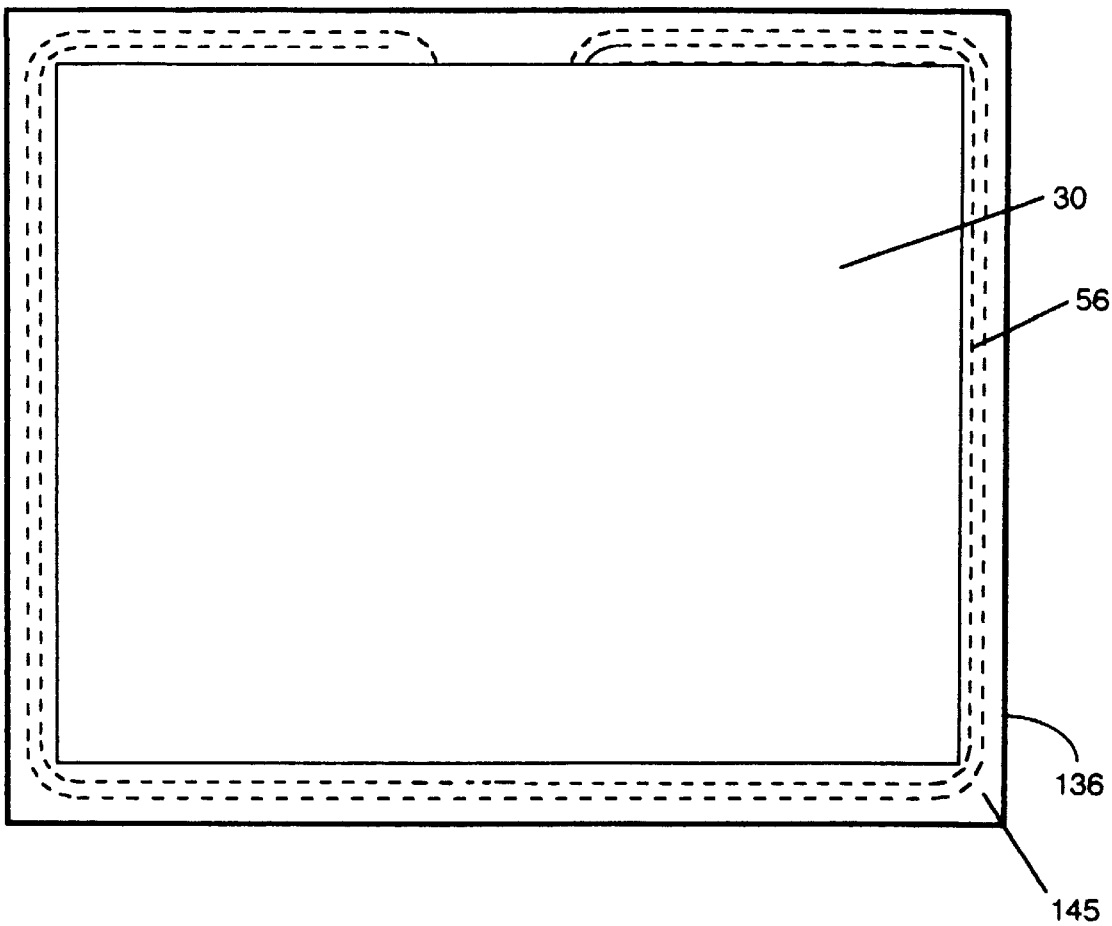
FIG. 2 is a top view of a heated substrate support plate with a substrate disposed thereon.

Referring now to FIG. 2, a top view of a substrate support plate 136 is shown. As noted, substrate support plate 136 includes upper face 145 for supporting a substrate, such as a glass panel 30, in the vacuum deposition process chamber. A heating element 56 is disposed beneath surface 145 of substrate support plate 136, a portion of which may be seen in phantom. Two heating elements may be disposed beneath the surface of the heated support plate, only one of which, however, is visible in this figure.

Figure 3:
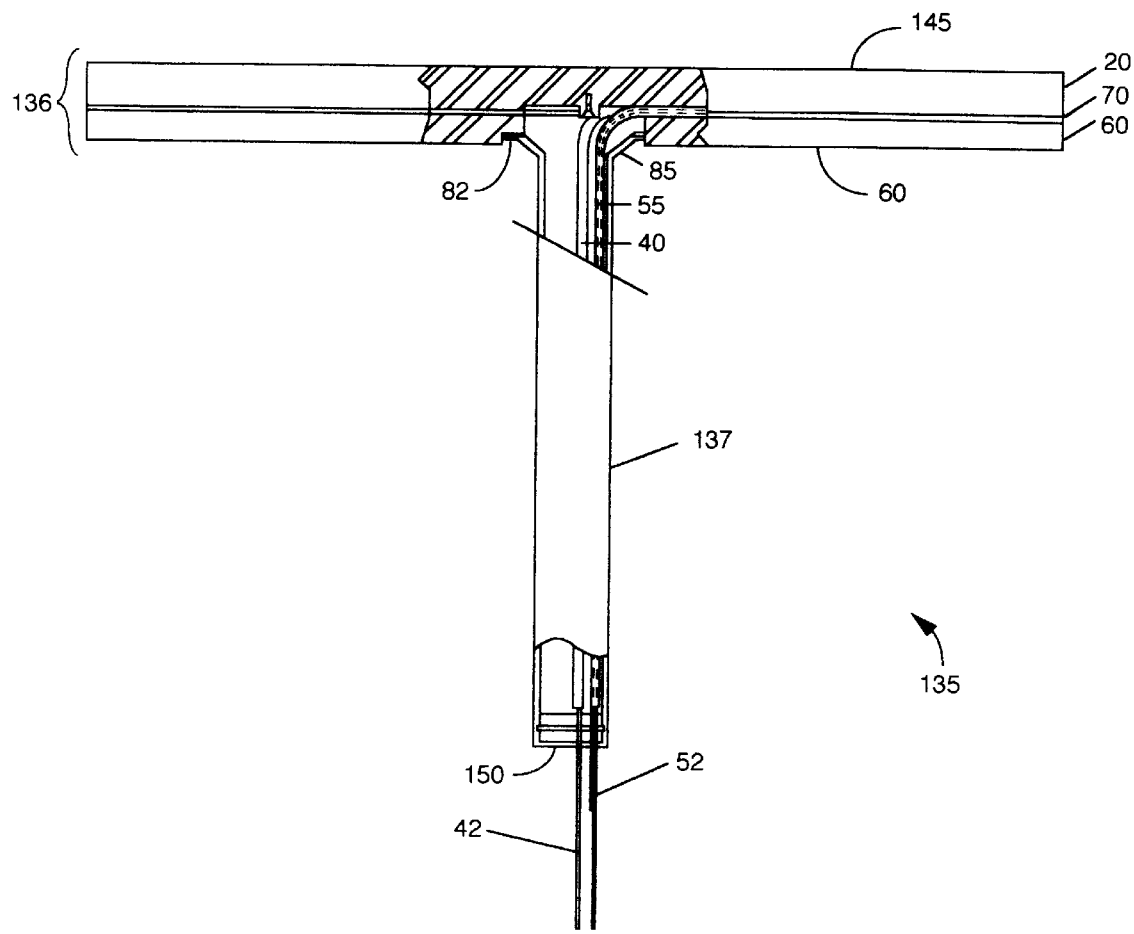
FIG. 3 is a side view of a susceptor including a cut-away view of the heated substrate support plate and stem.

FIG. 3 shows substrate support plate 136 attached to a stem 137 of susceptor 135. Substrate support plate 136 may be a rectangular shaped body fabricated of high purity 100.1 grade, unanodized, cast aluminum. The substrate support plate includes a base plate 60, a top plate 20 and a braised region 70 disposed therebetween. Disposed in base plate 60 are a pair of heating elements 54 and 56 (See also FIG. 5).

Stem 137 includes a hollow core and is configured to mate with base plate 60 of heated substrate support plate 136. A vacuum tight joint 85 is made such that the inside of the hollow core is at ambient (atmospheric) pressure.

A thermocouple tube 40, and heating element tubes 55, 57, 59 and 61 (heating element tube 57, 59 and 61 are visible in FIG. 5) are disposed within the hollow core of stem 137. Each heating element tube includes a conductor lead wire 52 (only one of which is shown in FIG. 3) for attachment to an end of a heater coil of a heating element. Thermocouple tube 40 includes a pair of thermocouple lead wires 42. At the heated support plate end of thermocouple tube 40, thermocouple lead wires 42 form a junction (not shown) for monitoring the temperature of heated substrate support plate 136. Thermocouple tube 40 and heating element tubes 55, 57, 59 and 61 and are terminated at the end of stem 137, and the lead wires are connected to a heater controller (not shown), which in turn powers the heating elements and monitors the temperature of the heated support plate.

A vacuum seal and ground connection for stem 137 is made at its bottom surface 150. Connections to the ends of the conductor lead wires and the ends of the thermocouple lead wires at the heater controller are made at atmospheric conditions.

Heating elements 54 and 56 are identical in construction, and only differ in length and positioning about the base plate portion of the substrate support plate. Accordingly, a description of the structure of only one heating element is provided.

Figure 4:
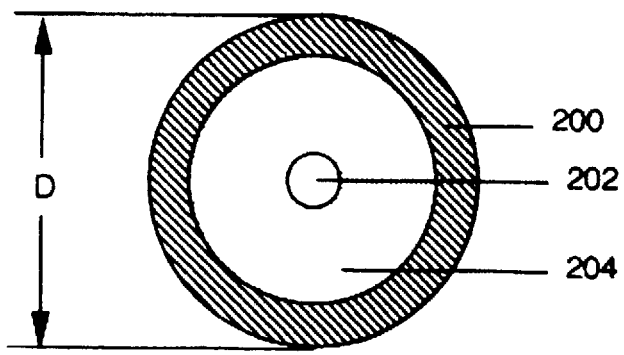
FIG. 4 is a cross-sectional view of a heating element according to one embodiment of the present invention before insertion into a base plate of the heated substrate support plate.

As is shown in FIG. 4, heating element 54 includes an outer sheath 200, a heater coil 202 and a heat-conducting filler material 204 disposed therebetween. In operation, the heat-conducting filler material prevents the short circuiting of the heating coil to the outer sheath by providing a good thermally-conductive path between the two. The outer sheath thereafter thermally communicates with the heated support plate to heat a substrate supported thereon. Any breakdown in the thermal path between the outer sheath and the heating coil of the heating element will result in the overheating of the heating coil, and premature failure (an open circuit) in the heating element.

Outer sheath 200 may be constructed of aluminum, and coil 202 may be constructed from a nichrome wire, which is a composite of nickel and chromium. In one embodiment, heat conducting filler material 204 is magnesium oxide. The heating element has a diameter D which may be about 0.314 inches.

Figure 5:
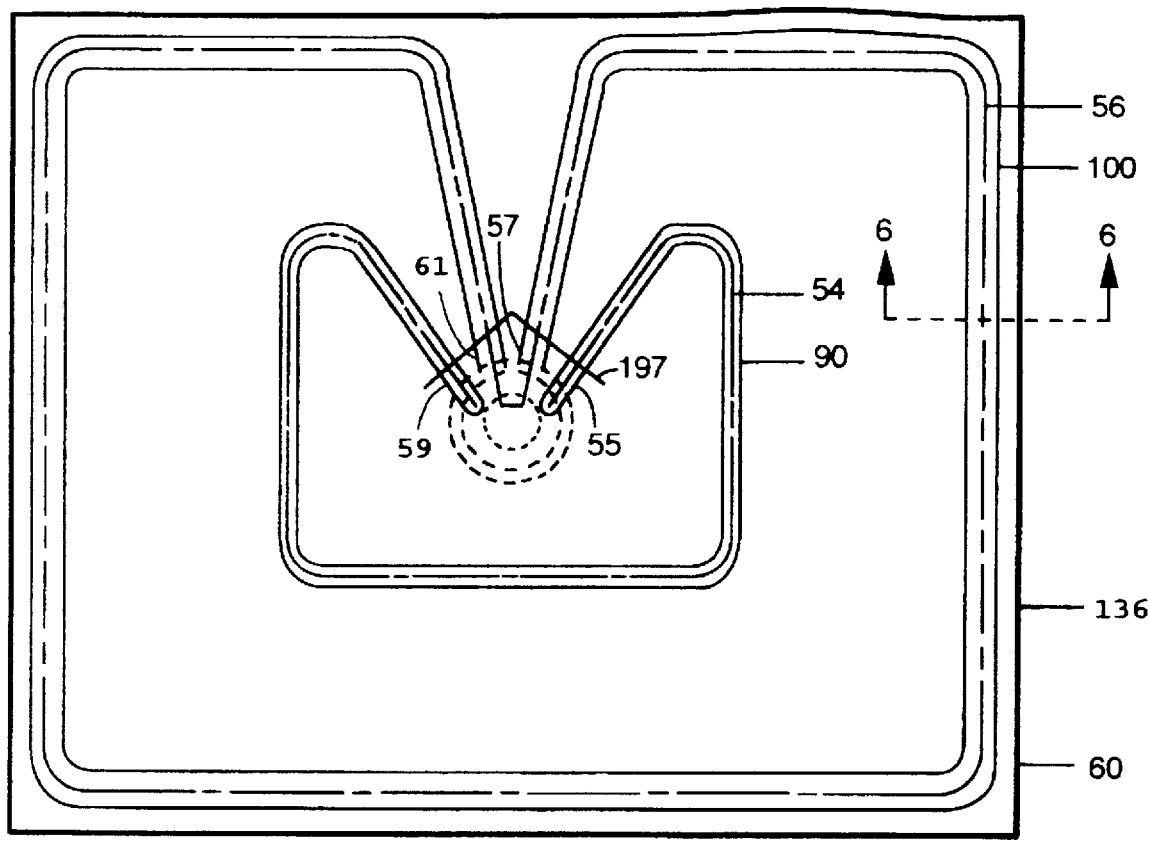
FIG. 5 is a top view of the base plate.

Referring now to FIG. 5, susceptor 135 is shown with top plate 20 and braised region 70 omitted in order to view base plate 60, and heating elements 54 and 56. Base plate 60 includes first and second grooved regions or channels 90 and 100 for heating elements 54 and 56, respectively.

Each end of heater coils 202 in heating elements 54 and 56 are connected to their respective conductor lead wires in heating element tubes 55, 57, 59 and 61, respectively, within heated substrate support plate 136 by a cold junction approximately at the line shown by reference numeral 197. Specifically, the nichrome heater coil of each heating element is bonded to each lead wire 52 at approximately this boundary 197 so that the center of heated substrate support plate 136 is not directly heated. At this same boundary, outer sheath 200 of each heating element 54 and 56 is bonded to heating element tubes 55, 57, 59 and 61 respectively. Alternatively, the heating element outer sheath may be extended down stem 137, encompassing lead wire 52 so as to eliminate the need for a separate heating element tube.

As can be seen in FIG. 5, the routing of the heating elements in base plate 60 provides dual and somewhat generally parallel loops running along inner and outer grooved regions 90 and 100. This dual loop pattern provides for a generally axially-symmetric temperature distribution across the base plate, while allowing for greater heat losses at its outside surfaces. A generally axially-symmetric temperature distribution is characterized by a temperature pattern which is substantially uniform for all points equidistant from a central axis which is perpendicular to the plane of the substrate support plate and extends through the center of the substrate support plate parallel to (and disposed within) the stem of the substrate support plate. The inside and outside loops may operate at different temperatures, the outside loops typically being operated at a higher temperature.

Under reduced gas pressure (vacuum) operating conditions, the thermal conduction between the heated support plate and a substrate resting atop it is not adequate to create a uniform substrate temperature even if the heated support plate temperature is uniform. This is because, when heated, a substrate resting atop a heated support plate will experience increased heat losses at the edge portions of the substrate. Accordingly, a heated support plate having nearly uniform temperature distribution across its entire surface will not compensate for the uneven heat loss characteristics of the substrate.

By operating the heating element in the outer loop at a higher temperature than the heating element in the inner loop, it is possible to compensate for the higher heat losses at the outermost or edge portions of the substrate. A substantially uniform temperature distribution is thus produced across the substrate in this fashion.

In one embodiment, the heated substrate support plate is rectangular in shape having a width of about 26.26 inches and length of about 32.26 inches, which allows for the processing of a glass substrate for flat panel displays up to 570 mm×720 mm in size. Heating elements 54 and 56 may be located about 1.5 in. (38.1 mm) from upper surface 145 of heated substrate support plate 136. In this embodiment, the outer heating element is run at approximately 0.66 in. from the outer edge of the base plate, while the inner heating element is run at approximately 7.75 in. from the outer edge. This configuration provides for uniform heating of a substrate placed atop heated substrate support plate 136.

Figure 6:
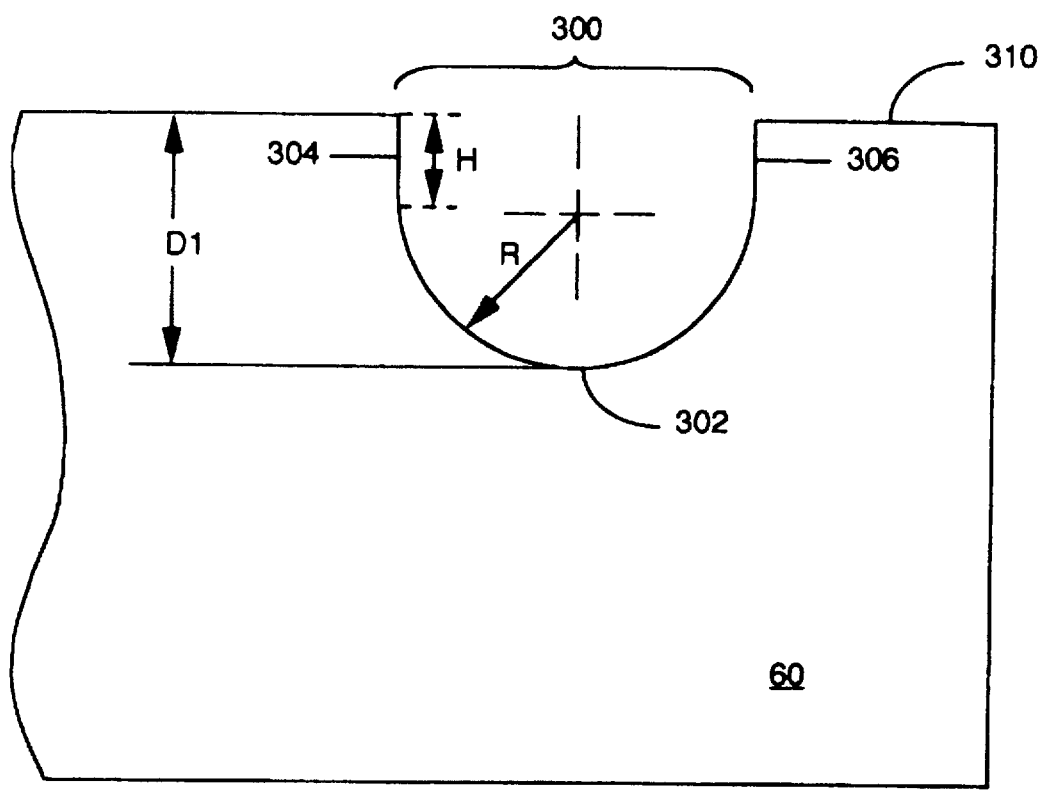
FIG. 6 is a cross-sectional view along line 6—6 of FIG. 4 of the recessed region of the base plate prior to assembly of the heating element.

As described above, base plate 60 includes grooved regions 90 and 100 for receiving heating elements 54 and 56, respectively. The grooved regions are similar in construction, and accordingly only one will be described. As shown in FIG. 6, the grooved regions are characterized by a generally semi-circular depression 300 within base plate 60. The depression includes a semi-circular well portion 302 having a radius R which is configured to receive a heating element. Depression 300 also includes vertical walls 304 and 306 which extend from top surface 310 of base plate 60 to well portion 302.

In one configuration, well portion 302 has a radius "R" equal to approximately 0.157 inches. Vertical walls 304 and 306 are approximately 0.104 inches in height "H", resulting in a total depth "D1" of the depression of approximately 0.261 inches from top surface 310 of base plate 60.

Figure 7A:
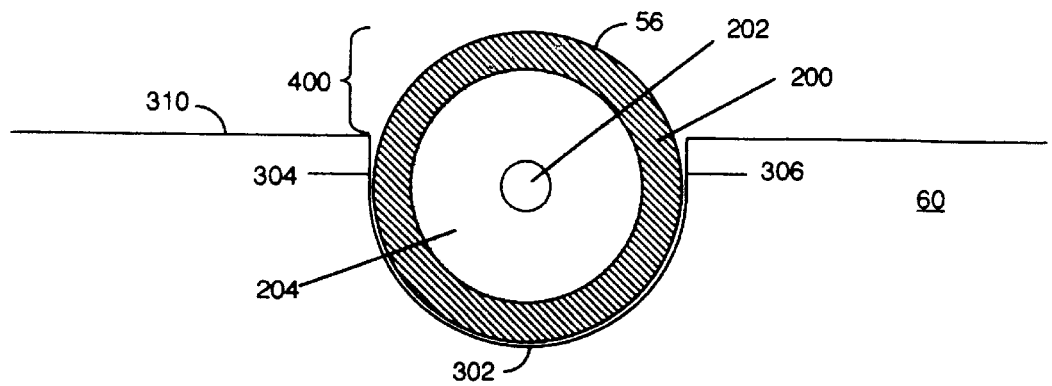
FIG. 7A shows a subassembly of the base plate after placement of the heating element into a recessed region thereof.

Referring now to FIG. 7A, a subassembly 700 of base plate 60 and heating element 56 is shown. As noted, heating element 54 is fabricated in a similar fashion. During assembly process, heating element is laid within depression 300 of base plate 60 as shown. The configuration results in a top-most portion 400 of the heating element extending above top surface 310 of base plate 60.

The heating element fits loosely in well region 302 with a minimal gap about its circumference. In this configuration, approximately one-sixth of the height of the heating element extends beyond top surface 310 of base plate 60. As can be seen, the heating element is not in close proximity, relatively speaking, to vertical walls 304 and 306 at the top most portion 400 of the heating element.

Figure 7B:
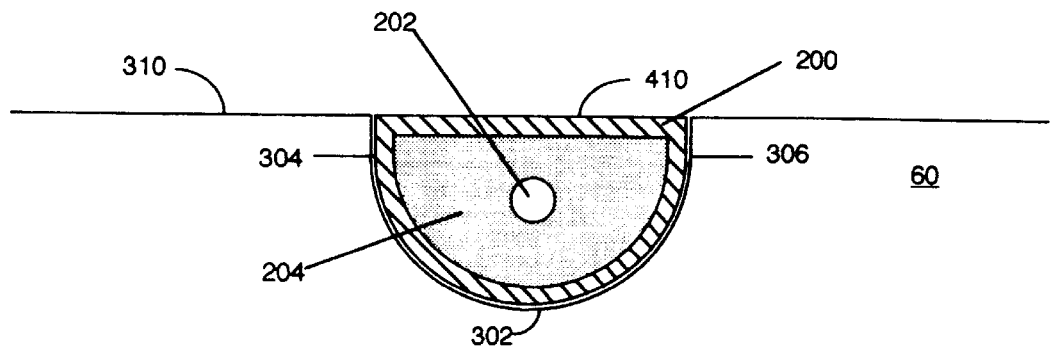
FIG. 7B is the subassembly of FIG. 7A after compression.

The heating element and base plate subassembly of FIG. 7A after compression are shown in FIG. 7B. Compression is performed by a hydraulic press and aluminum block combination which provides 30 to 40 tons per five linear inches over the length of the heating element and base plate grooved region. There, of course, are other means of compressing the heating element into depression 300. For example, a very large hydraulic press may be used, with the compression of the heating element occurring in a single compression stroke.

The compressed heating element includes a top surface 410 which is essentially flush with top surface 310 of base plate 60. The compaction level of heat conducting filler material 204 within the compressed heating element is approximately 3.0 grams per cubic centimeter after compression. This compaction level is achieved because of the support provided by side walls 304 and 306, and well region 302 of base plate 60 in conjunction with sheath 200.

As the hydraulic press compresses the heating element into depression 300, heat-conducting filler material 204 is compacted in the interior of the heating element about heater coil 202. Ordinarily, the compaction of the heat-conducting filler material would not exceed 2.3 grams per cubic centimeter because of the thin wall aluminum construction of outer sheath 200. However, the use of grooves or channels 90 and 100 for containing the heating elements allows for compaction levels greater than 3.0 grams per cubic centimeter. Compaction levels to between about 2.75 and 3.5 grams per cubic centimeter allow for improved power and heat density performance. A compaction level of approximately 3.0 grams per cubic centimeter or higher is preferred.

Figure 7C:
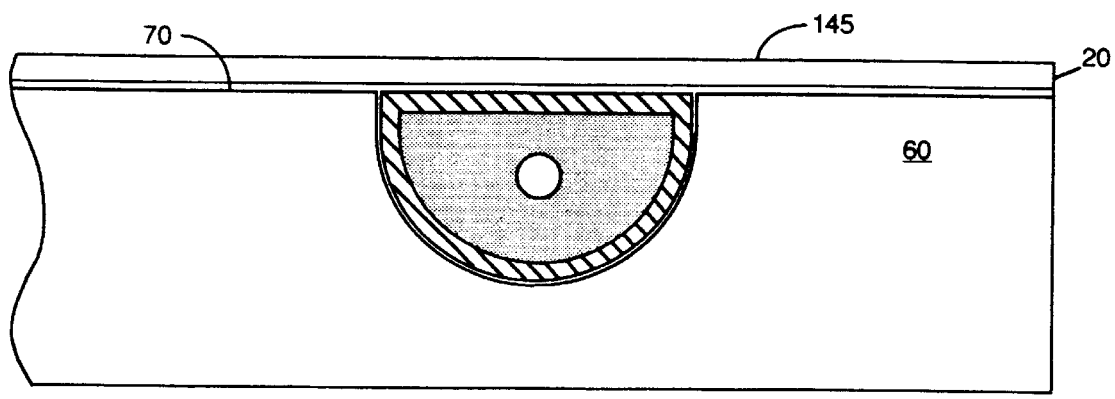
FIG. 7C is the subassembly of FIG. 7B after braising a top plate to the base plate.

Referring now to FIG. 7C, after the compaction process is complete, an aluminum braising material is used to braise top plate 20 to base plate 60 forming braised region 70. The braising is performed to join the top and base plate portions, and to provide the maximum possible thermal conductivity between the parts. Alternatively, the plates may be joined by welding.

In use, the heating elements which were compressed according to the present invention were able to sustain heat densities in excess of 75 watts per inch. In addition, since the heating element outer sheaths and the substrate support plate are both constructed of aluminum, the thermal expansion characteristics of these parts are identical. Thus, compensation for thermal expansion is not required, even at operating temperatures close to the melting point of aluminum or an aluminum alloy, which may be used in the construction of the substrate support plate and heating element outer sheath.

In an alternative embodiment, heating elements 54 and 56 may be compressed into grooves located in top plate 20. The only difference from the process described above is the location of the heating elements in the top plate as opposed to the base plate.

Alternatively, heated substrate support plate 136 may be constructed from a single plate structure with heating elements 54 and 56 encased or embedded therein. In one embodiment of an encased structure, heating elements 54 and 56 are compacted prior to being encased into heated substrate support plate 136. Specifically, heating elements 54 and 56 are compressed, as described above, into a grooved region of a support block. The support block may be generally a solid rectangular tube constructed from aluminum having a groove cut in a upper surface thereof for receiving a heating element. The support block is shaped to conform to the general shape of the heating element (e.g. a loop pattern as described above in relationship to heating elements 54 and 56). A single heating element is compressed into the support block, and the combination is thereafter encased in a substrate support plate. The combination may be encased by placing the support block in a mold and forming the support plate around it.

In summary, an apparatus for heating a substrate in a vacuum deposition process chamber comprising a substrate support plate including a compressible heating element has been described.

While the present invention has been described with reference to a specific embodiment, the description is illustrative of the invention and is not to be construed as limiting. Various modifications may occur to those of ordinary skill in the art without departing from the true spirit and scope of the invention as defined by the appended claims.

What is claimed is:

1. A substrate support structure for heating and supporting a substrate in a processing chamber, comprising:

a plate including a groove in a surface thereof having a width and a depth wherein the depth of the groove is less than the width; and a heating element having an outer sheath having a diameter substantially equal to the width of the groove, a heater coil and a heat-conducting filler material disposed therebetween, said heating element initially positioned in said groove such that an upper portion of the outer sheath extends substantially above said surface and wherein said heating element is thereafter compacted such that said outer sheath is deformed by compression so that said outer sheath is substantially flush with said surface with said heat-conducting filler material compacted about said heater coil.

2. The heated support plate of claim 1 wherein said plate and said outer sheath are constructed from aluminum.

3. The heated support plate of claim 1 wherein said heat-conducting filler material is magnesium oxide.

4. The heated support plate of claim 3 wherein said heat-conducting filler material is compacted to between about 2.75 and 3.5 grams per cubic centimeter.

5. The heated support plate of claim 3 wherein said heat-conducting filler material is compacted to between about 3.0 and 3.5 grams per cubic centimeter.

6. A substrate support structure for heating and supporting a substrate in a processing chamber, comprising:

a plate including first and second channels in a surface thereof, said channels having a width and a depth where the depth of the channels is less than the width and where the channels are configured so that they do not cross one another; and first and second heating elements each having an outer sheath having a diameter substantially equal to the width of the channels, a heater coil and a heat-conducting filler material disposed therebetween, said first and second heating elements initially positioned in a corresponding one of said first and second channels such that an upper portion of the outer sheath extends substantially above the surface and wherein said heating element is thereafter compacted such that said outer sheath is deformed by compression so that said outer sheath is substantially flush with the surface and said heat-conducting filler material is compacted about said heater coil of said first and second heating elements.

7. A substrate support structure for heating and supporting a substrate in a processing chamber, comprising:

a top plate having a top surface and bottom surface, said top surface for supporting said substrate;

a bottom plate having a top surface joined to said bottom surface of said top plate;

one of said top plate and said bottom plate including a groove having a first depth; and a heating element having an outer sheath with a diameter substantially larger than said first depth, a heater coil and a heat-conducting filler material disposed therebetween, said heating element initially positioned in said groove and extending above said top surface, and said outer sheath deformed by compression so that said heat-conducting filler material is compacted about said heater coil.

8. An apparatus, comprising:

a vacuum processing chamber for processing a substrate at a substrate processing location therein; and a heated substrate support structure for supporting said substrate at said substrate processing location, said support structure including:

(I) a base plate constructed from a first material and including a groove having a first depth, and (ii) a heating element having an outer sheath having a diameter substantially greater than said first depth and constructed from said first material, a heater coil and a heat-conducting filler material disposed therebetween, said heating element initially disposed within said groove and extending above a top surface of said base plate, said outer sheath deformed by compression so that said heat-conducting filler material is compacted about said heater coil.

9. The apparatus of claim 8 wherein said first material is aluminum.

10. The apparatus of claim 9 wherein said heat-conducting filler material is magnesium oxide.

11. The apparatus of claim 10 wherein said heat-conducting filler material is compacted to between 2.75 and 3.5 grams per cubic centimeter.

12. The apparatus of claim 10 wherein said heat-conducting filler material is compacted to between about 3.0 and 3.5 grams per cubic centimeter.

13. The apparatus of claim 8 wherein said groove comprises first and second channels configured so that said channels do not cross one another with one of said heating elements disposed in each of said channels.

14. An apparatus, comprising:

a support plate for supporting a substrate in a processing chamber, said support plate including a base plate constructed from a first material and including a plurality of grooves in a surface thereof, said grooves having a width and a lesser depth, and forming inner and outer loops about said base plate, said outer loop extending about a path adjacent to a perimeter of said base plate and said inner loop extending about a path closer to a central portion of said base plate;

a heating element disposed in each of said grooves, each of said heating elements including an outer sheath constructed from said first material and initially having a diameter substantially larger than said depth, a heater coil and a heat-conducting filler material disposed between said outer sheath and said heater coil; and said outer sheath of each of said heating elements deformable by compression so said heating elements fit within said grooves such that said outer sheath of each of said heating elements is flush with said top surface of said base plate and said heat-conducting filler material is compacted about said heater coil.

15. The apparatus of claim 14 wherein said first material is aluminum.

16. The apparatus of claim 14 wherein said heat-conducting filler material is magnesium oxide.

17. The apparatus of claim 16 wherein said heat-conducting filler material is compacted to between about 2.75 and 3.5 grams per cubic centimeter.

18. The apparatus of claim 17 wherein said heat-conducting filler material is compacted to between about 3.0 and 3.5 grams per cubic centimeter.

19. A method of making a substrate support structure comprising:

providing a plate including a groove in a surface thereof having a width and a depth less than the width; and providing a heating element having an outer sheath having a diameter substantially equal to the width of the groove, a heater coil and a heat-conducting filler material disposed therebetween;

positioning said heating element in said groove such that an upper portion of the outer sheath extends substantially above the surface; and compacting said heating element so that said outer sheath is substantially flush with said surface and said heat conducting filler material is compacted about said heater coil.

* * * * *